Sept. 3, 1968 W. A. REIMER 3,400,210
INTERLAYER CONNECTION TECHNIQUE FOR MULTILAYER
PRINTED WIRING BOARDS
Filed April 26, 1966 3 Sheets-Sheet 1

INVENTOR.
BY WILLIAM A. REIMER
Spencer E. Olson
ATTY.

Sept. 3, 1968 W. A. REIMER 3,400,210

INTERLAYER CONNECTION TECHNIQUE FOR MULTILAYER PRINTED WIRING BOARDS

Filed April 26, 1966 3 Sheets-Sheet 2

Sept. 3, 1968 W. A. REIMER 3,400,210

INTERLAYER CONNECTION TECHNIQUE FOR MULTILAYER PRINTED WIRING BOARDS

Filed April 26, 1966 3 Sheets-Sheet 3

United States Patent Office 3,400,210

Patented Sept. 3, 1968

3,400,210

INTERLAYER CONNECTION TECHNIQUE FOR MULTILAYER PRINTED WIRING BOARDS

William A. Reimer, Wheaton, Ill., assignor to Automatic Electric Laboratories, Inc., Northlake, Ill., a corporation of Delaware Filed Apr. 26, 1966, Ser. No. 545,414
1 Claim. (Cl. 174—69.5)

ABSTRACT OF THE DISCLOSURE

A plurality of stepped recesses formed in the upper surface of a multilayer printed wiring board expose the ends of conductors disposed on the inner layers of the board, and the exposed conductor ends are interconnected by a plurality of conductive strips plated on the stepped walls of each recess by a method which involves the use of collimated light and photo-resist techniques. The plated strips, which extend from top to bottom of the recess interconnecting the conductor ends exposed on the stepped recess walls between the top and bottom upper board surfaces, are wider than the conductor ends so that the portion of a strip contacting one of the ends can be removed without interrupting the continuity of the strip.

This invention relates to multilayer printed wiring boards and methods for their manufacture, and more particularly to a technique for providing selective electrical interlayer connections between conductors disposed on a plurality of insulating sheets which form the layers of the board.

The increasing usage of micromodules and solid-state integrated circuits has given rise to the development of new methods for interconnection, one of the most promising of which is the multilayer printed wiring concept.

In one technique for manufacturing a multilayer printed wiring board described in the copending U.S. application of J. C. Eckhardt et al., Ser. No. 481,742, filed Aug. 23, 1965, and assigned to the assignee of the present application, the conductors on various layers of a multilayer printed wiring board are interconnected by means of a number of conductive strips selectively plated on the walls of slots formed in the board in contact relationship with the exposed ends of the conductors. Although the interconnection method described in this application yields wiring densities required for interconnecting miniature electronic devices, electrical continuity between the interlayer connections depends on the achievement of an integral bond between the ends of the inner layer conductors exposed at the edges of the apertures and the conductive strips plated on the aperture walls, which are disposed in perpendicular relationship with the conductor ends.

Another multilayer printed wiring interconnection technique is described in U.S. Patent 3,052,823, and is an adaptation of the "clearance-hole" method, whereby the conductors on various layers of the board are interconnected via solder connections made in stepped holes formed in the board. In the "clearance-hole" method, the amount of conductor surface exposed facilitates the making of reliable interconnections; however, the use of stepped holes tends to reduce the number of locations at which these connections can be made and thereby decrease the packaging density of the board. Furthermore, the number of layers that could be used in a "clearance-hole" type board of the prior art was limited because of the problems involved in effecting a good solder connection through the depth of the clearance hole, and interconnections were limited to conductors on adjacent layers.

It is, therefore, an object of this invention to provide a new and improved multilayer printed wiring board.

It is another object to provide a new and improved method for providing interlayer connections in a multilayer printed wiring board.

It is yet another object to increase the reliability of interlayer connections in a multilayer printed wiring board.

According to a preferred embodiment of the invention a method for manufacturing a multilayer printed wiring board includes forming a plurality of recesses each having a stepped wall and opening to at least one outer surface of the board to expose the ends of the conductors disposed on a surface of the sheets which form the inner layers, and selectively plating conductive strips of substantially uniform thickness on the stepped walls of each recess in contact relationship with the exposed ends of the conductors to selectively electrically interconnect the conductors on different ones of said sheet surfaces.

A feature of this invention is the use of a collimated light source together with a photographic mask to selectively expose to light the photosensitized surfaces of a multilayer board.

Another feature of this invention is that a multilayer board, having at least one stepped recess, has the ends of certain inner layer conductors exposed in the recess, interconnected with one another by conductive strips, and arranged so that the portions of the strips in contact relationship with the exposed portions of predetermined ones of the conductors can be removed so that only the balance of the conductors are selectively electrically interconnected by the strips.

It is still another feature of the invention that a multilayer board is provided with a plurality of stepped recesses for providing access to the conductors on the inner layers of the board, and that certain conductive strips are plated down one side of the recess continuously, across an insulating base layer, and up another side of the recess so as to permit the establishment of a "non-blocking" wiring pattern.

These and other objects and features will become more apparent from the following detailed description which makes reference to the accompanying drawings, in which.

Figures 1, 2, 3:
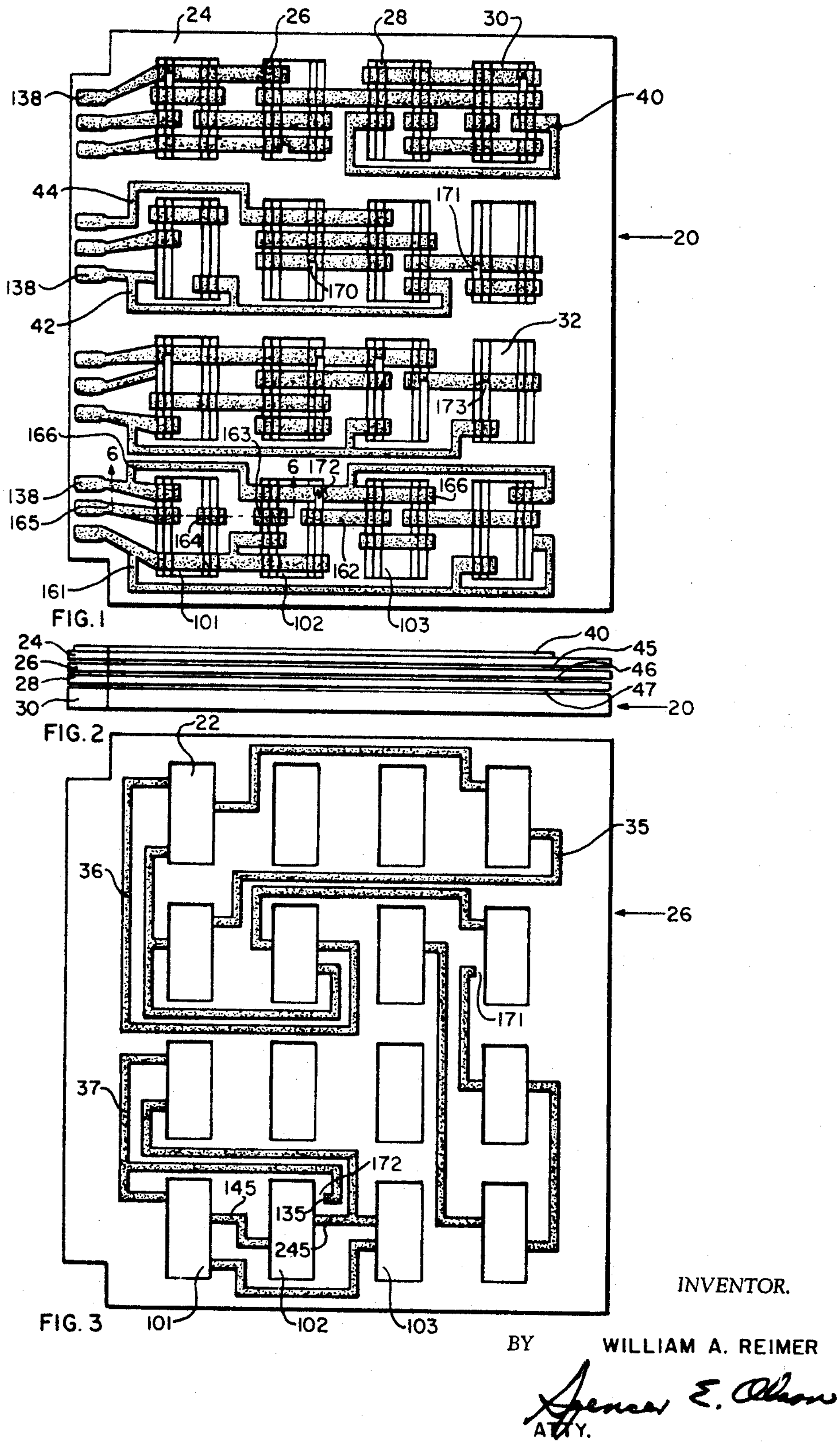
FIG. 1 is a plan view of a multilayer printed wiring board constructed in accordance with the principles of the invention.
FIG. 2 is a side view of the board shown in FIG. 1.
FIG. 3 is a plan view of one of the internal wiring layers of the board.

Referring now to FIGS. 1 and 2, according to a preferred embodiment of this invention, a multilayer printed wiring board 20 comprises a plurality of insulating sheets 24, 26, and 28, stacked upon another insulating sheet 30 which is somewhat more rigid than the other sheets and which serves as a base for the composite structure. These sheets may be of an epoxy glass laminate or some other material which exhibits dielectric properties. Patterns of conductors 45, 46, and 47 are disposed on surfaces of sheets 26, 28, and 30 which become internal in the composite board.

A plurality of conductors, such as 42 and 44, which form the surface wiring pattern and conductive strips, such as 161, 162, 163 and 164, which provide the interconnections between the conductors disposed on sheets 24, 26, 28, and 30 are selectively plated on the surfaces of the board by a unique process to be described hereinafter. Access to the conductors printed on the inner layers of the board is had by means of the stepped recesses such as 32 which have been formed in the board.

FIG. 3 is a plan view of sheet 26, one of the layers of the composite board. Conductors 35, 36, and 37 extend across portions of the sheet and terminate at an edge of one of a plurality of apertures such as 22 which have been formed in the sheet to provide access to the conductors on the underlying sheet. Corresponding apertures are formed in sheet 24 to expose the conductors on sheet 26 and on sheet 28 to expose the conductors on sheet 30.

Only a few conductors have been shown for clarity and, in a more typical layer, the wiring density would be considerably greater. One of the conductors 135 appears to terminate just short of an aperture. This is the result of the selective removal of the end of the conductor and the contacting portion of the interconnecting strip 166 by a process to be described.

The apertures are preferably punched in the individual sheets after the conductor patterns have been established. Note that sheet 30 is not perforated so that a rigid base is provided for the multilayer structure. If desired, however, apertures could be provided in sheet 30 to facilitate mounting of components.

In the preferred embodiment described herein, the apertures are shown to be rectangular in cross-section and staggered in width only. The straight edges provided by rectangular apertures increase the interconnection density as will become evident when the technique for plating the conductive strips on the surfaces of the recess is discussed. After the apertures have been formed, the sheets are stacked together and aligned so that the apertures in the individual sheets overlie one another and a composite board is formed by laminating under heat and pressure. Because of the mutually staggered dimensions of the apertures, a plurality of recesses opening to the upper surface of the board and having stepped walls, are formed in the composite board, and the ends of the conductors which are to be interconnected are exposed in the recesses.

The formation of the multilayer board up to this point is completed using standard "clearance-hole" multilayer techniques; the remaining steps required to complete the fabrication of the board are the subject of the present invention.

The method of establishing the surface wiring pattern and the multiple conductor pattern on the stepped surfaces of the recesses will now be described in detail. These patterns are established using a technique similar to that shown in an article entitled "3-Dimensional Printed Wiring" by E. A. Guditz in Electronics, June 1, 1957, pages 160–163.

Figure 4:
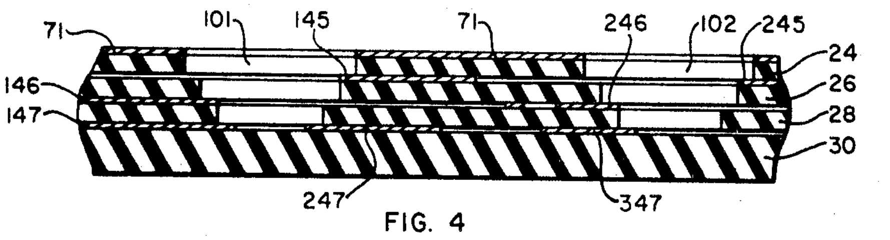
FIG. 4 is a sectional view of the board.
Figure 5:
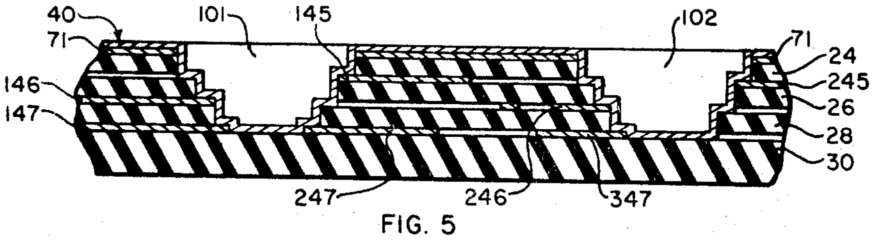
FIG. 5 is similar to FIG. 4 but shows a conductive coating applied to the exposed surfaces of the board.

FIG. 4 is a sectional view of the board prior to the establishment of the surface wiring pattern. The ends of conductors 145, 146, 147 and 247 are exposed on the extended edges of layers 26, 28, and 30, respectively, which form the stepped walls of a recess 101. All of the exposed surfaces of the board, including the conductor bearing surfaces of the recesses, are then copper plated using standard techniques. A thin layer of copper 71 which is adhesively bonded to the upper layer 24 of the board provides a base for the copper plate. FIG. 5 is a cross-sectional view of the board showing the copper plating 40.

Figure 7:
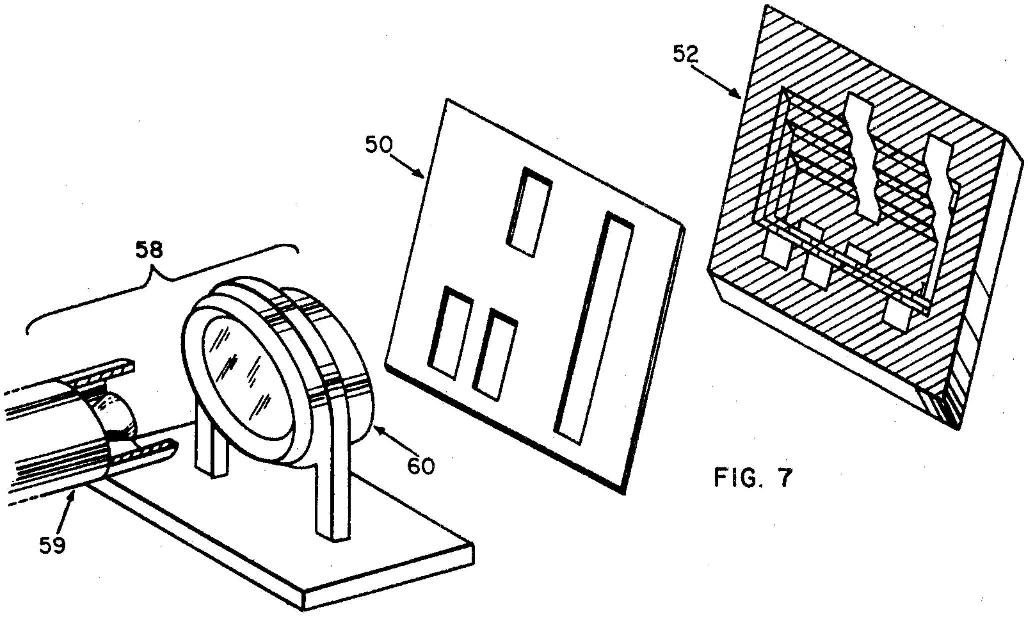
FIG. 7 is a simplified drawing of a technique for passing a beam of light through a photographic mask to selectively expose the surfaces of the board to light.

After the surfaces of the board have been plated, they are uniformly coated with a film of photosensitive resist, and exposed to light. FIG. 7 is a simplified drawing of the exposure process. The light source 58 consists of a high intensity xenon lamp 59, which has its rays collimated by a lens 60. A xenon lamp is used to minimize the amount of time required for exposing the photosensitized surfaces to light.

During the exposure, photographic mask 50, having the image of the desired surface-to-layer wiring pattern, is positioned between the light source 58 and the photosensitized board 52, and is held in intimate contact with the plane surfaces of the board. The collimated light source is projected through the mask, transferring sharply defined bands of light, which correspond to the clear and the opaque areas of the image on the photographic mask, onto the plane surfaces of the board and the stepped walls of the recesses.

The use of a collimated light source together with an appropriate mask permits a number of strips to be plated on the stepped walls of each recess. Thus, although the use of stepped recesses does limit the number of interconnection locations somewhat, the number of discrete interconnections in each recess is determined by the limitations of the etching technique employed.

The optimum configuration for the recess is rectangular because the beam of light projected through the mask follows the contour of the surface on which the light is projected and the straight edges will tend to confine the light to a narrow area so as to permit plating of the maximum number of conductive strips on the recess walls.

After the surfaces have been selectively exposed to light, they are photographically developed and then electroplated with nickel and gold. The desired surface wiring pattern and the pattern of selective interconnections are established by a chemical etching process. The gold plating serves as an acid-resist during the etching process to protect that portion of the copper plate that will form the surface conductors and, because of the photoexposure process described above, those portions of the original copper plating which are to be removed have not been able to retain the acid-resistive gold plating and are unprotected so that when the board is placed in an acid bath, the unprotected portions of copper are etched away leaving the desired conductor pattern on the plane surfaces of the board and a plurality of conductive strips plated on the stepped surfaces of each recess.

Figure 6:
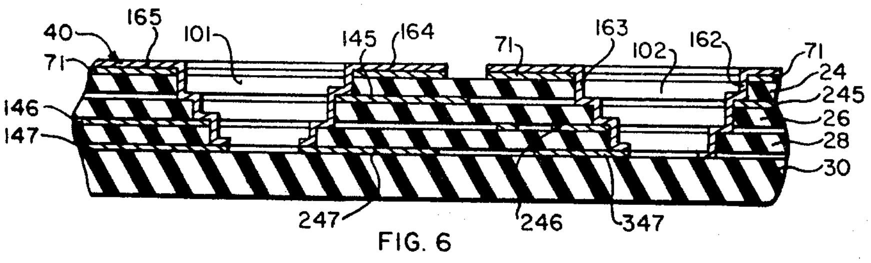
FIG. 6 is a cross-sectional view taken along 6—6 of FIG. 1.

FIG. 6 is a cross-sectional view taken along 6—6 in FIG. 1. In this view it can be seen that the conductive strips conform to the surfaces on which they are plated. The strips are substantially uniform in thickness and the thickness of the strips is determined by the length of the plating cycle.

The establishment of a reliable electrical connection as well as a good mechanical bond between the conductive strips and the exposed portions of the conductors is insured by the exposure of a sufficient amount of conductor surface area to serve as a base for the plating of the copper layer of the conductive strips. Subsequent platings of nickel, to add strength, and gold, to increase the conductivity of the plated strips, provide integral conductive elements so that in FIG. 8, each of the plated conductors has been shown to comprise a single layer. For clarity, however, the ends of the inner layer conductors are illustrated as being separate from the strips.

Conductive strips 162, 163, 164, and 165 interconnect the printed conductors exposed on the stepped surfaces of recesses 101 and 102. Conductive strip 165 extends from the top to the bottom of recess 101 and interconnects one of the contact tabs 138, which have been provided on sheet 24 and which supply input connections from other boards and from power supplies via a standard printed circuit connector (not shown), conductor 146 on sheet 28, and conductor 147 on sheet 30. On the opposite wall of the same recess, another conductive strip 164 interconnects conductor 145 on sheet 26 and conductor 247 on sheet 30. The use of plated strips as the interconnection medium facilitates connections between conductors on non-adjacent sheets.

Conductive strip 163 interconnects conductor 246 on sheet 28 and conductor 347 on sheet 30 exposed on one wall of recess 102.

Figure 8:
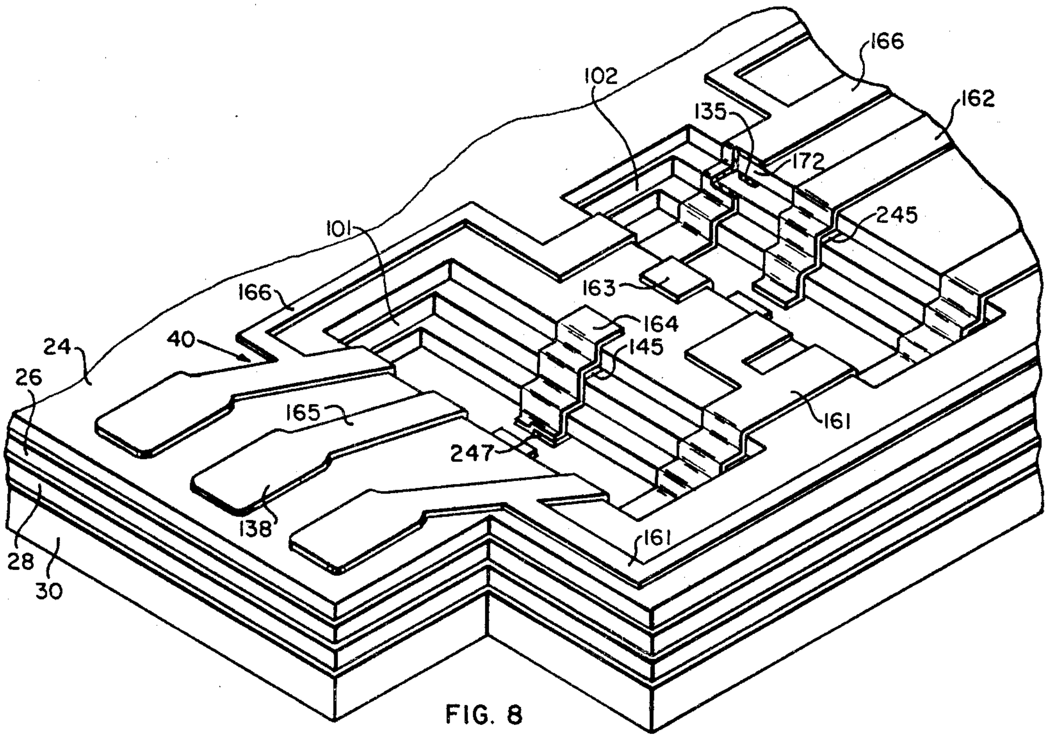
FIG. 8 is an enlarged perspective view of a preferred embodiment of the board.

In FIG. 1, it can be seen how portions of the conductive strip have been removed at locations such as 170, 171, 172, and 173. This is an illustration of the flexibility of the interconnection technique of this invention. One of the points 172 at which a change has been made in the interconnections after the final plating of the board is shown in FIG. 8.

The plated interconnection formed by conductive strip 166 had included conductor 135 on sheet 26. In this instance, it was desirable to eliminate this connection and so the portion of the copper plate and of the conductor end which were joined at location 172 have been physically removed, for instance, by milling. All of the plated conductors such as 166 are wider than the conductors, such as 135 on sheet 26, disposed on the inner layers so that when the portions which are in contact relationship have been removed, the remaining connections made by the strip 166 have not been disturbed.

This technique may be used to make corrections in a board either where a layout error has gone undetected until the board was completed or where such a correction is required due to changes in the application of the board.

In another instance, it may prove feasible to use a master mask in the exposure process which will permit the plating of all possible conductive strips in both desired and undesired locations and those portions of the conductive strips which contact the exposed portions of predetermined ones of the conductors can be selectively removed by this process, so that only the balance of the conductors are selectively electrically interconnected by the conductive strips.

Note that conductive strip 166 has been extended across the base sheet 30 and up the opposite wall of the recess and, as shown in FIG. 1, terminates at recess 103 where additional connections are made. This is an example of how the packaging density of the board is increased by the use of "non-blocking" wiring patterns. Rather than having to route conductors around the recesses wherein the interlayer connections are made, the conductors are advantageously routed directly through the recesses so that the conductors traverse the shortest path possible and the need for using the inner layers to provide conductor cross-overs can be eliminated.

The length of each of the conductive strips is determined by the image pattern on the mask that is used during the selective exposure process and noting in FIG. 8 that conductive strip 162 in recess 102 does not provide any useful function by extending the depth of the recess because no conductor ends are exposed on sheets 20 and 30 and if desired, by proper masking the conductive strip could be plated only between layers 24 and 26.

In the particular embodiment described in this application, provision has been made to plate a maximum of only eight conductors in each recess, and only a few connections are shown in each of the views. However, the number of conductive strips that may be plated in each of the recesses of the board depends on the requirements of the system in which the board will be used.

The multiple-conductor plated recess technique can be used to provide circuit interconnections for integrated circuitry, such as flat-packs. To interconnect flat-packs, fourteen conductive strips are provided in each recess, and the flat-pack leads are attached to the conductive strips by a suitable process such as welding or soldering. It is also possible to interconnect discrete components such as transistors, diodes and passive elements by attaching them to the conductive strips.

Although the invention has been described in detail in connection with a preferred embodiment, it is to be understood that this is by way of example and not intended as a limitation to the spirit and scope of the invention as defined by the following claim.

What is claimed is:

1. A multilayer printed wiring board comprising: insulating sheets bonded together to form a composite board having first and second outer surfaces; conductors disposed on the surfaces of said sheets in a predetermined pattern; at least one aperture in each of several of said sheets, the apertures in the individual sheets overlying each other and being of mutually staggered dimensions, so as to form a recess having a wall stepped from sheet to sheet, said recess opening to said first outer surface of said board, and selected ones of said conductors on each of said plurality of sheets extending to a boundary edge of the aperture of the corresponding sheet so that a portion of each said selected conductor is exposed in said recess; and a plurality of strips of conductive material, said strips being of substantially uniform thickness and being selectively plated on, and conforming to the shape of, the stepped wall of said recess, a portion of each strip in contact relationship with the exposed portions of certain of said conductors for selectively electrically interconnecting the conductors on different ones of said sheet surfaces; each of said interconnecting strips being wider than the width of the exposed portions of said conductors, so that for each strip selectively interconnecting certain of said conductors disposed on different ones of said sheet surfaces, the portion of the strip in contact relationship with the exposed portion of any of said certain conductors can be severed from said strip without interrupting the continuity of said strip so that the unsevered ones of said certain conductors remain selectively electrically interconnected by said strip.

References Cited

UNITED STATES PATENTS 3,052,823 9/1962 Anderson et al. ----- 174—68 X

DARRELL L. CLAY, *Primary Examiner.*